US010324112B2

(12) United States Patent
Prabhugoud et al.

(10) Patent No.: US 10,324,112 B2
(45) Date of Patent: Jun. 18, 2019

(54) PACKAGE TESTING SYSTEM AND METHOD WITH CONTACT ALIGNMENT

(71) Applicant: Intel Corporation, Santa Clara, CA (US)

(72) Inventors: Mohanraj Prabhugoud, Hillsboro, OR (US); Andrew J. Hoitink, Beaverton, OR (US); Abram M. Detofsky, Tigard, OR (US); Joe F. Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 15/370,870

(22) Filed: Dec. 6, 2016

(65) Prior Publication Data

US 2018/0045759 A1 Feb. 15, 2018

Related U.S. Application Data

(60) Provisional application No. 62/373,538, filed on Aug. 11, 2016.

(51) Int. Cl.
*G01R 1/073* (2006.01)
*G01B 7/00* (2006.01)
(Continued)

(52) U.S. Cl.
CPC ......... *G01R 1/07328* (2013.01); *G01B 7/003* (2013.01); *G01R 1/06794* (2013.01); *G01R 31/2891* (2013.01)

(58) Field of Classification Search
CPC ......... G06F 2203/04104; G06F 3/0304; G06F 3/0428; H02J 7/045; G01R 31/2827; G01R 31/327; G01R 1/06794; G01R 1/07; G01R 1/07328; G01R 31/2891; G01S 17/08; G01S 7/412; H01L 21/67259; H01L 21/681; H01L 21/6838; G01B 7/003
See application file for complete search history.

(56) References Cited

U.S. PATENT DOCUMENTS

| 4,328,553 | A | * | 5/1982 | Fredriksen | ............ | H01L 21/681 |
| | | | | | | 125/13.01 |
| 4,565,966 | A | * | 1/1986 | Burr | ...................... | G01R 31/088 |
| | | | | | | 324/519 |

(Continued)

*Primary Examiner* — Vinh P Nguyen
(74) *Attorney, Agent, or Firm* — Schwabe, Williamson & Wyatt, P.C.

(57) ABSTRACT

Embodiments of the present disclosure provide techniques and configurations for a package testing system. In some embodiments, the system may comprise a printed circuit board (PCB), including one or more sensors disposed adjacent to a corner of the PCB to face a package to be tested, to detect an electrical edge of the package. The PCB may include a contactor array disposed to face respective interconnects of the package. The system may further include a controller coupled with the one or more sensors, to process an input from the one or more sensors, to identify the electrical edge of the package, and initiate an adjustment of a position of the PCB relative to the package, based at least in part on the electrical edge of the package, to substantially align contacts of the contactor array with the respective interconnects of the package. Other embodiments may be described and/or claimed.

18 Claims, 5 Drawing Sheets

(51) Int. Cl.
    *G01R 1/067* (2006.01)
    *G01R 31/28* (2006.01)

(56) References Cited

U.S. PATENT DOCUMENTS

| | | | | |
|---|---|---|---|---|
| 5,006,808 A | * | 4/1991 | Watts | G01R 31/2805 324/537 |
| 5,744,964 A | * | 4/1998 | Sudo | G01R 31/2805 324/519 |
| 6,353,327 B2 | * | 3/2002 | Nishikawa | G01R 1/06794 324/750.17 |
| 8,098,412 B2 | * | 1/2012 | Kagami | H01L 21/681 250/559.29 |

* cited by examiner

PACKAGE TESTING SYSTEM AND METHOD WITH CONTACT ALIGNMENT

CROSS-REFERENCE TO RELATED APPLICATIONS

The present application claims priority to U.S. Provisional Patent Application No. 62/373,538, filed Aug. 11, 2016 and titled "CAPACITIVE BASED INPUT FOR ACTIVE FINE PITCH ALIGNMENT," the entire disclosure of which is hereby incorporated by reference.

FIELD

Embodiments of the present disclosure generally relate to the field of integrated circuits and in particular to methods of testing of integrated circuits.

BACKGROUND

Current integrated circuit (IC) testing techniques utilize methods that require careful alignment of IC components (packages) during testing. In a testing environment, alignment of a contactor array of a testing equipment (e.g., residing on a printed circuit board (PCB)) to an interconnect array of a package (e.g., a bottom package of the Package-on-Package (PoP) configuration) may be done using passive mechanical alignment, which may involve referencing physical edges of the package. However, current top side interconnect pitches (e.g., in the PoP configuration) may be scaled down from the current 0.4 mm to 0.2 mm and lower. In view of further scaling of IC components, current alignment methodologies may not be able to yield desired alignment accuracy, which may affect quality of testing of IC components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
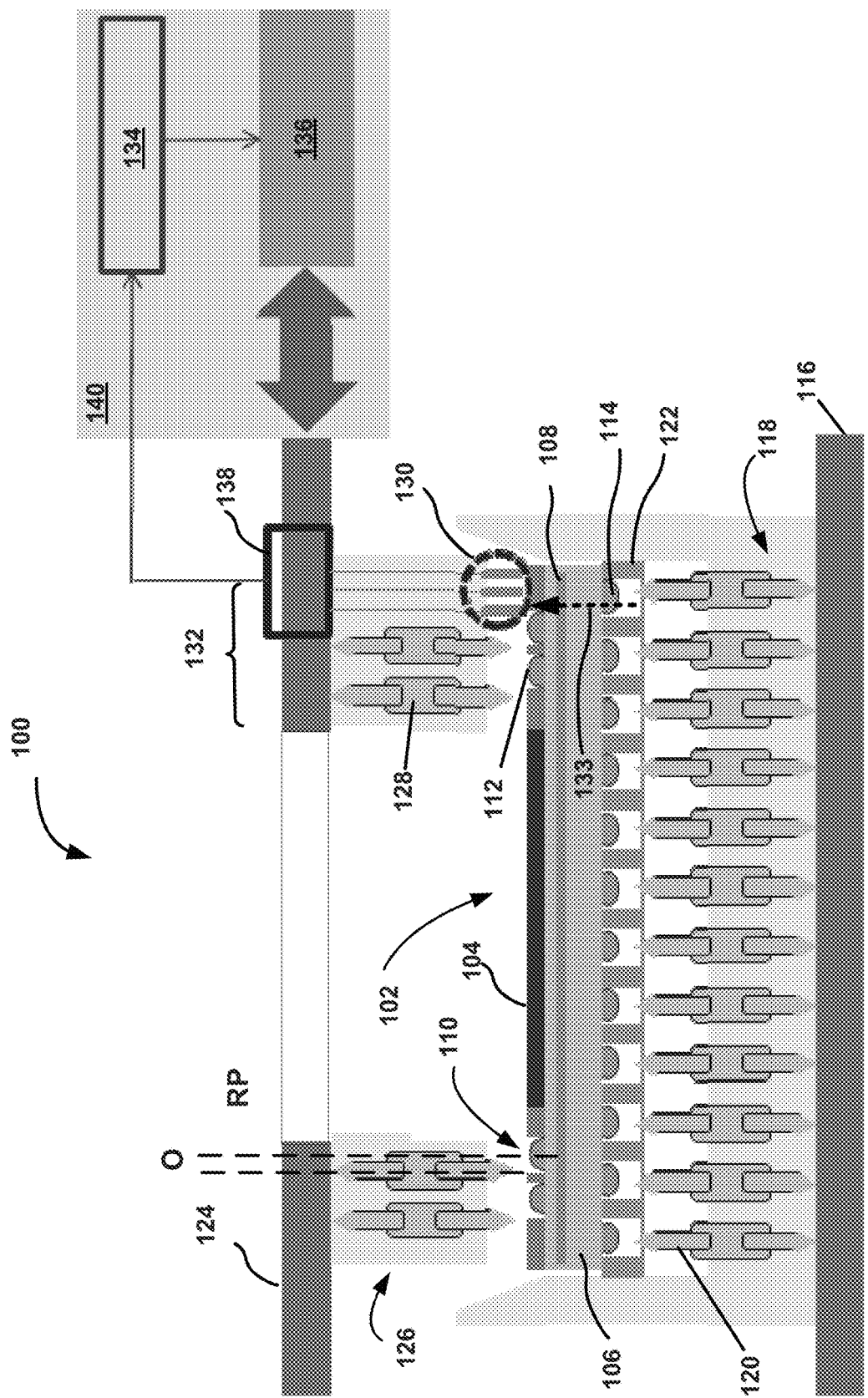
FIGS. 1-3 illustrate an example system for testing packages with contact alignment, in accordance with some embodiments.

Embodiments of the present disclosure include techniques and configurations for a package testing system, which may be configured to align a contactor array of the testing system to an interconnect array of a package to be tested. In some embodiments, the system may comprise a printed circuit board (PCB), including one or more sensors disposed adjacent to a corner of the PCB to face a package to be tested, to detect an electrical edge of the package. The PCB may include a contactor array disposed to face respective interconnects of the package to be tested. The system may further include a controller coupled with the one or more sensors, to process an input from the one or more sensors, to identify the electrical edge of the package, and initiate an adjustment of a position of the PCB relative to the package, based at least in part on the electrical edge of the package, to substantially align contacts of the contactor array with the respective interconnects of the package to be tested, and to provide electrical connection between the contacts of the contactor array with the respective interconnects of the package during testing of the package.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In a testing environment, interconnects of the package may need to be tested. For example, interconnect arrays of a package may be tested for signal capacity, integrity, and the like. In order to test the contacts of interconnect arrays, the contacts of a testing equipment may need to be aligned with respective contacts of an interconnect array, to ensure electrical contact. The embodiments described herein provide for sensing of an electrical edge of the package and subsequent alignment of the contacts of the testing equipment with the interconnect array of the package, based on a result of the sensing.

Figure 2:
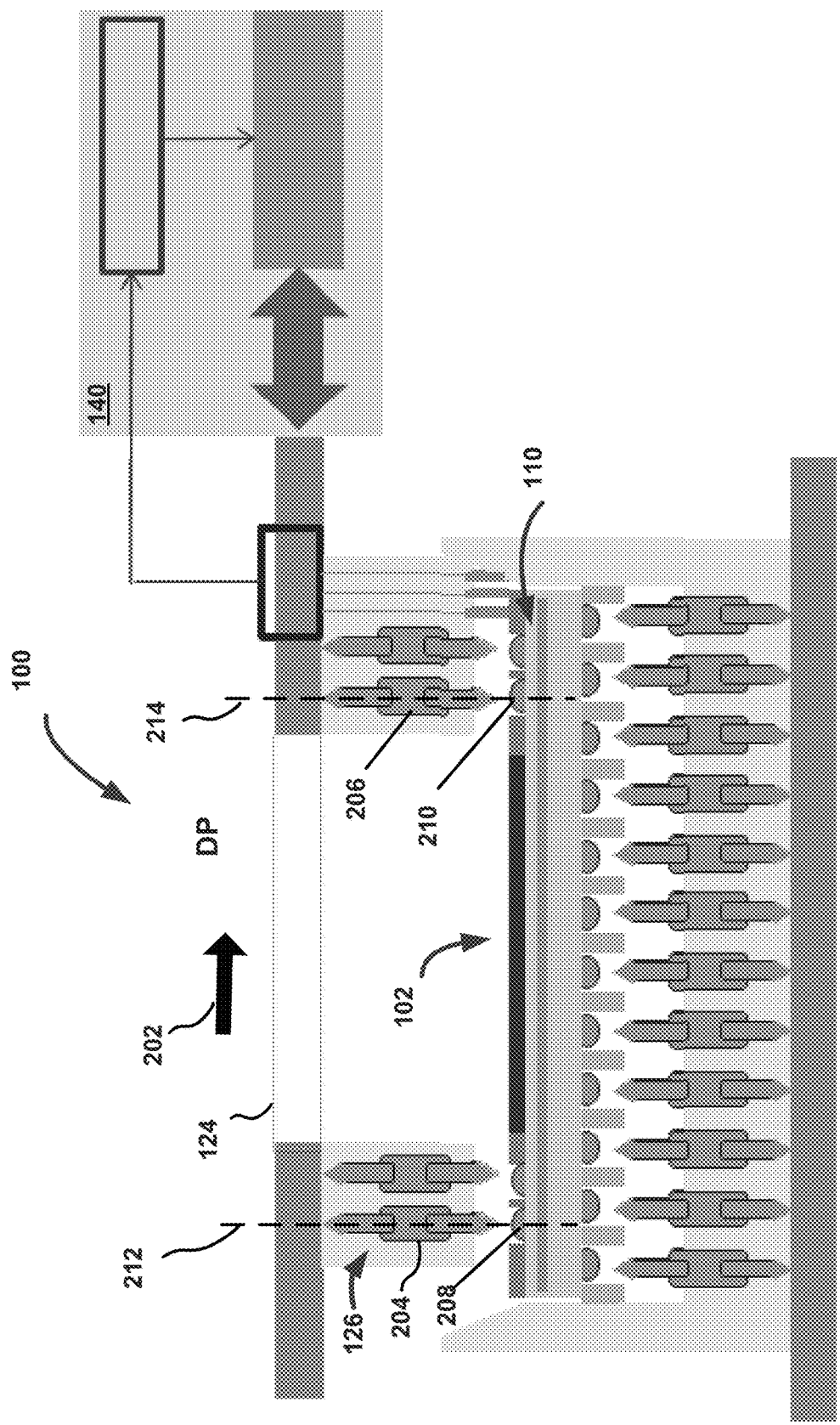
Figure 3:
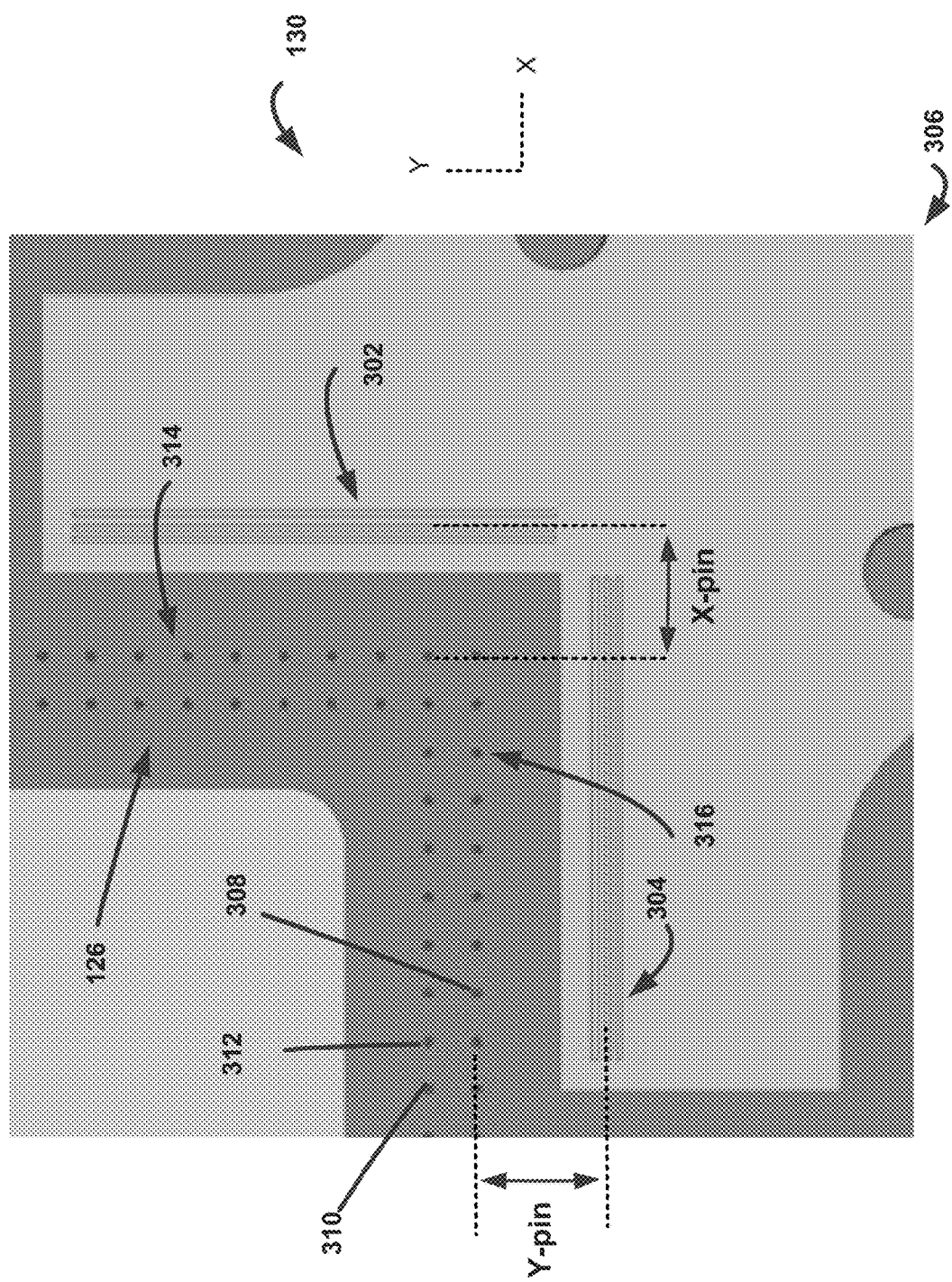

FIGS. 1-3 illustrate an example system for testing packages with contact alignment, in accordance with some embodiments. More specifically, FIG. 1 illustrates the testing system in a non-aligned (sensing) state of the test contacts with the package interconnect array. FIG. 2 illustrates the testing system in an aligned state of the test contacts with the package interconnect array. FIG. 3 illustrates a view of an example portion of a testing PCB with sensors configured to sense an electrical edge of a package under test, in accordance with some embodiments. For ease of understanding, like components of FIGS. 1-3 are indicated by like numerals.

As shown, the testing system 100 may be provided for testing a device under test (DUT), such as a package 102. The package 102 may include a die 104 disposed on a substrate 106. For example, in a PoP configuration, the die 104 may comprise a memory die. In general, the die 104 may comprise any kind of compute logic.

The substrate 106 may include a package metal layer 108 embedded in the substrate 106, as shown. The package 102 may further include an interconnect array 110 disposed substantially around the die 104 on the substrate 106. In the PoP configuration of the package 102, in which the package 102 comprises a bottom package of the PoP, the interconnect array 110 may comprise a top side interconnect array. In embodiments, the interconnect array 110 may include a plurality of interconnect components (contacts) 112, such as ball-type contacts (balls), as shown, or other types of contacts. The package 102 may further include another interconnect array 114 (e.g., bottom side interconnect array), comprising multiple contacts, such as balls, as shown, or other types of contacts.

The testing system 100 may include various testing components. For example, the testing system 100 may include a PCB 116, configured with testing circuitry. The PCB 116 may include a bottom side contactor array 118, which may be disposed on top of the PCB 116. As shown, the bottom side contactor array 118 may include multiple contacts (e.g., pogo pins) 120. A floating plate 122 may be disposed on top of the contactor array 118. During testing, the package 102 may rest on the floating plate 122, as shown. Further, during testing, the contactor array 118 may contact respective contacts of the bottom side interconnect array 114, to provide desired connectivity between the DUT (package 102) and the testing equipment residing on the PCB 116.

The testing system 100 may further include another testing component, such as a PCB (e.g., top side PCB) 124, which may also include testing circuitry and/or passive components necessary for testing of the DUT. The PCB 124 may include a top side contactor array 126. As shown, the PCB 124 may be disposed opposite (e.g., above) the package 102 during testing. In embodiments, the PCB 124 may comprise a frame-shaped PCB, with the top side contactor array 126 arranged around the perimeter of the frame, e.g., at least around two adjacent sides of the PCB 124.

The top side contactor array 126 may include multiple interconnect components, such as contacts 128. In embodiments, the contacts 128 may comprise pogo pins. During testing, the contacts 128 may connect with respective contacts (e.g., balls) 112 of the interconnect array 110 of the DUT (package 102), to enable electrical contact between the top side interconnect array 110 and the top side contactor array 126, which may be necessary for testing.

As shown in FIG. 1, when the PCB 124 is placed in an initial position relative to the package 102, the pins (contacts) 128 of the top side contactor array 126 may be offset (out of alignment) with respect to their counterpart contacts 112 of the top side interconnect array 110.

In some embodiments, in order to provide a desired alignment of the top side contactor array 126 with the interconnect array 110, one or more sensors 130 may be used to sense a conductive feature (e.g., electrical edge) of the package 102. The desired alignment may include a substantial alignment (e.g., with a desired precision) of the contacts of the top side contactor array 126 with respective contacts of the interconnect array 110.

The sensors 130 may be disposed on the PCB 124, e.g., adjacent to the top side contactor array 126. A sensor location may be such as to place the sensor at a tunable distance above and/or below the surface of the DUT (package 102). In some embodiments, for example, where an alignment of the contactor array 118 with respective interconnect array 114 may be needed for testing, the sensors 130 may be located adjacent to the contactor array 118 on the PCB 116. The example in which the sensors 130 are located on the PCB 124 is described herein for purposes of illustration and is not limiting this disclosure.

FIG. 3 illustrates a view of an example portion of the PCB 124 of FIG. 1, in accordance with some embodiments. More specifically, FIG. 3 illustrates a view of the portion 132 of the PCB 124 from the perspective indicated by arrow 133 in FIG. 1. As shown, the sensors 130 may include at least two sensors 302 and 304 disposed substantially perpendicularly to each other on the PCB 124, for example, adjacent to a corner 306 of the PCB 124. Such disposition of the sensors 130 may allow for sensing of the electrical edge of the package 102 if the PCB 124 is moved in X- or Y-directions relative to the package 102, as indicated by the X Y axis in FIG. 3. As described in reference to FIG. 3, the top side contactor array 126 may be disposed substantially around a frame-shaped PCB 124. The pins (contacts) 128 are indicated by dots 308, 310, 312 in FIG. 3.

In the illustrative embodiments, the sensors 302, 304 may be capacitance based. In some embodiments, inductance based sensors may be used for DUT's electrical (e.g., conductive) edge detection. In some embodiments, vision sensors to sense the DUT's edge detection and communicate with a mechanical actuator to align top side contactor array to top side interconnect array.

The sensors 302, 304 may be used to collect capacitance data and detect the electrical (conductive) edge of the package metal layer 108. More specifically, the sensor 302 may be used to measure capacitance in X-direction, and sensor 304 may be used to measure capacitance in Y-direction. As shown, the sensors 302, 304 may be disposed at respective distances X-pin and Y-pin from respective closest rows of pins 314 and 316 that form the top side contactor array 126.

The measured capacitance may be a difference between respective capacitances measured at different X, Y positions of the PCB 124 relative to the package 102. The differences in the respective capacitances may indicate an electrical edge of the package metal layer 108, and accordingly, the edge of the package 102. In general, two or more sensors disposed as shown in FIG. 3 may be used to detect DUT electrically conductive edges (hereinafter "electrical edges") in two orthogonal directions and align to top side interconnect array. In some embodiments, a calibrated network of sensors in each orthogonal direction may be used to detect DUT electrical edge. The electrical edge to be sensed may include a top layer or inner conductive layers of the DUT's PCB substrate 106, such as the layer 108.

In response to sensing the edge, the PCB 124 may be caused to move (in X- and/or Y-directions) from its initial (e.g., reference) position to a position of alignment of the top side contactor array 126 with the top side interconnect array 110. In some embodiments, mechanical actuation (e.g., with a controller operating a motor) may be used to drive the PCB 124 from its reference position (RP in FIG. 1) to a desired position (DP in FIG. 2) of alignment.

In order to provide capacitance detection processing and corresponding actuation of movement of the PCB 124, the system 100 may include a positioning unit 140, as shown in FIGS. 1 and 2. The positioning unit 140 may include a microcontroller 134 coupled with an actuation device (e.g., motor) 136. The microcontroller 134 may be configured to receive and process capacitance data sensed by the sensors 130. The capacitance data may be provided to the microcontroller 134 via an analog-to-digital converter (ADC) 138. In embodiments where the sensors comprise capacitive sensors, ADC 138 may be a capacitance to digital converter (CDC), e.g., circuitry provided to convert the sensor capacitance signal to a digital signal.

The microcontroller 134 may be further configured to calculate a desired position of the PCB 124 relative to the package 102, based on the received sensor data. Further, the microcontroller 134 may be configured to calculate a mechanical force to apply to the PCB 124, in order to move the PCB 124 to the desired position. To apply the mechanical force, the actuation device 136 may be physically coupled to the PCB 124 and configured to move (as indicated by arrow 202 in FIG. 2) the PCB 124 to the desired position DP. In some embodiments, such movement may occur incrementally, via a number of incremental movements of the PCB 124 in X- and/or Y-directions. In other words, microcontroller 134 may output the required amount of motor steps to the motor of the actuator 136. The motor may actuate (e.g., in linear movement) the top side PCB 124 to align the top side contactor array 126 to top side interconnect array 110.

Actuation may take different forms. For example, a lead screw and nut coupled with stepper motor may be used as actuation. Rack and pinion, cam, belt driven, piezoelectric, and other suitable mechanisms can be used to translate rotary motion of motor to linear motion (with open and/or closed loop feedback).

As a result, the PCB 124 may move from a reference position RP characterized by the offset O (shown in FIG. 1) between pins of the top side contactor array 126 and respective contacts (balls) of the interconnect array 110, to a desired position DP, in which the pins of the top side contactor array 126 (e.g., 204, 206) are aligned with respective contacts of the interconnect array 110 (e.g., 208, 210), as indicated by respective imaginary alignment lines 212, 214. It should be noted that the offset O is shown in FIG. 1 for one direction (e.g., X or Y). It will be appreciated that an offset between pins of the top side contactor array 126 and respective contacts of the interconnect array 110 may also exist (and be taken into account when calculating a desired position of the PCB 124) in another direction, perpendicular to the one shown in FIG. 1 (e.g., Y or X respectively).

In some embodiments, the system 100 may include a handler thermal unit (not shown), which may be provided to control the temperature of the DUT. In addition, the handler thermal unit may apply a mechanical load required for the top side contactor array 126 actuation.

In order to provide measurements of the capacitance values associated with an electrical edge of the package 102 and enable desired alignment of the top side contactor array 126 with the interconnect array 110, the sensors 130 (e.g., 302 and 304 of FIG. 3) may be calibrated. Calibration may be done for each sensor and for one unit of DUT (e.g., one type of package 102). Calibration may be specific to each product, as package electrical edge may be different for each product. The sensor calibration may provide for determining offset values O (see FIG. 1) in X- and Y-directions (hereinafter referenced as X-offset and Y-offset respectively). In other words, differences between locations of pins of the top side contactor array 126 and respective contacts of interconnect array 110 in the X, Y coordinate system may be determined.

Figure 4:
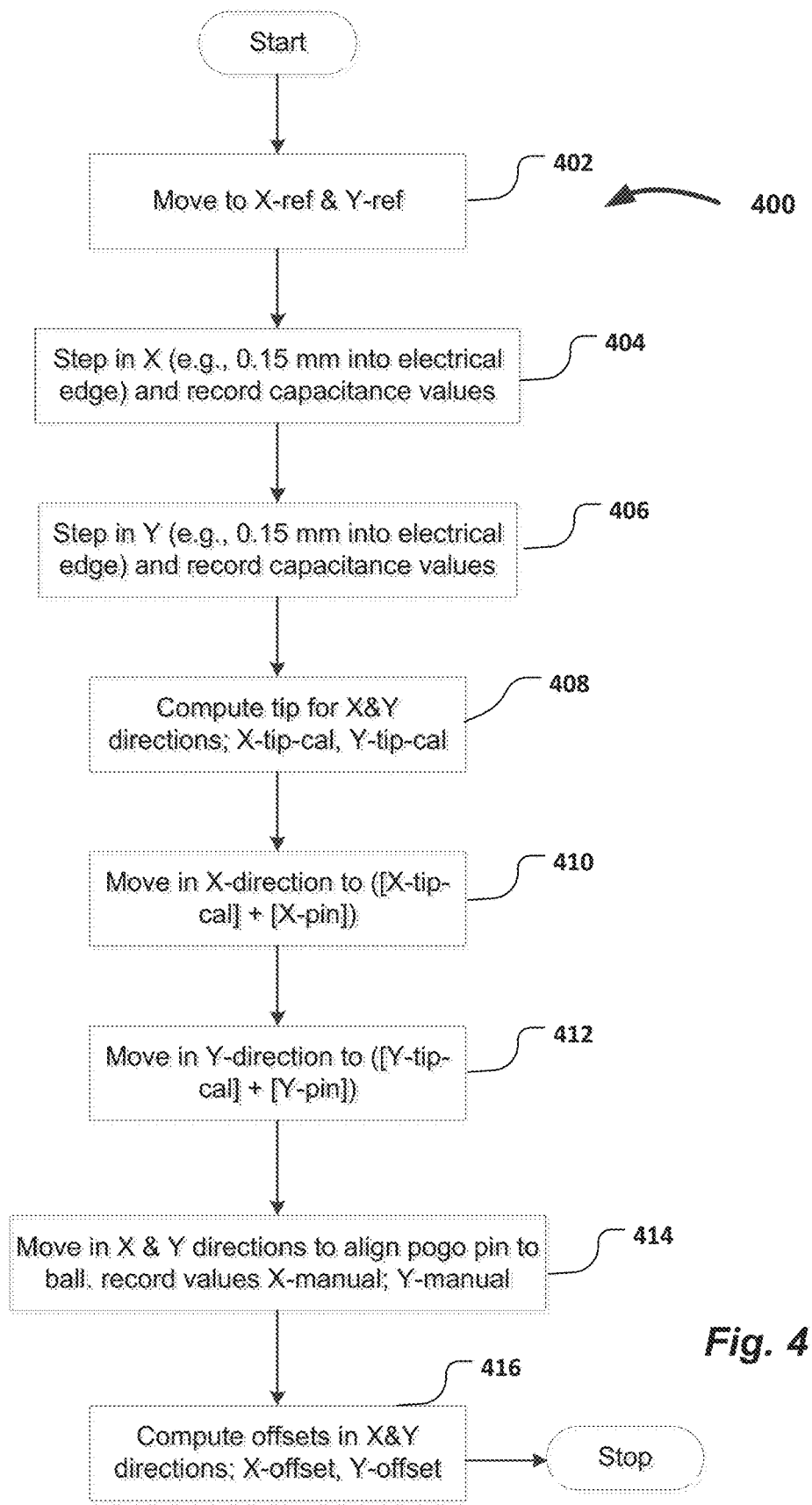
FIG. 4 is an example process flow diagram for sensor calibration in a system for testing packages, in accordance with some embodiments.

FIG. 4 is an example process flow diagram for sensor calibration in a system for testing packages, in accordance with some embodiments. The process 400 will be explained with continuous reference to the system of testing packages of FIGS. 1-3. The process 400 (with possible exception of block 414) may be performed by the controller 134 of the system 100, which may cause the components of the positioning unit 140 to perform actions described in the process 400. For example, the controller 134 may cause the positioning unit 140 to move the PCB 124 as described below. Further, the controller 134 may perform the calculations according to the actions described below.

At block 402, the PCB 124 may be moved to a reference position (X-ref; Y-ref) relative to the package 102. X-ref may be a known reference distance from the sensors 130 (e.g., sensor 302) to the DUT electrical (conductive) edge in X-direction. Y-ref may be a known reference distance from the sensors 130 (e.g., sensor 304) to DUT electrical edge in Y-direction. For example, X-ref and Y-ref may equal zero. In other words, a reference position may be characterized by a starting position from which the sensing of the electrical edge of the package may commence.

At block 404, the PCB 124 may be moved a step in X-direction (the step may comprise, for example, a distance of about 0.15 mm toward the electrical edge of the package 102), sense and record capacitance values, using sensors 130. In some embodiments, this linear step may be driven by a motor rotary step.

At block 406, the PCB 124 may be moved a step in Y-direction (the step may comprise, for example, a distance of about 0.15 mm toward the electrical edge), sense and record capacitance values, using sensors 130. In some embodiments, this linear step may be driven by a motor rotary step.

At block 408, the peak values X-tip-cal, Y-tip-cal of measured capacitance in X-direction and Y-direction may be computed. The peak capacitance values may indicate a location of the DUT's electrical edge in the calibration process. For example, X-tip-cal may be the DUT's electrical edge in X-direction as detected by sensor 302. Y-tip-cal may be a DUT's electrical edge in Y-direction as detected by sensor 304.

At block 410, the PCB 124 may be moved in X-direction to a position defined by X-tip-cal+X-pin At block 412, the PCB 124 may be moved in Y-direction to a position defined by Y-tip-cal+Y-pin. The position of the PCB 124 defined by X-tip-cal+X-pin and Y-tip-cal+Y-pin may be a position in which the pin(s) of the top side contactor array 126 may align with the ball(s) of the interconnect array 110.

At block 414, the PCB 124 may be moved in X- and Y-directions (in some instances, manually) to align pogo pins of the top side contactor array 126 with respective contacts (balls) of the interconnect array 110. The respective coordinate values X-manual and Y-manual may be recorded.

At block 416, the offset values X-offset, Y-offset may be computed. For example, X-offset may be equal (X-tip-cal)+(X-pin)−(X-manual), and Y-offset may be equal (Y-tip-cal)+(Y-pin)−(Y-manual).

When the sensor calibration is completed and the offset values are calculated as described in reference to FIG. 4, the alignment of the PCB 124 with the package 102 (e.g., alignment of the top side contactor array 126 with the top side interconnect array 110) may be accomplished.

Figure 5:
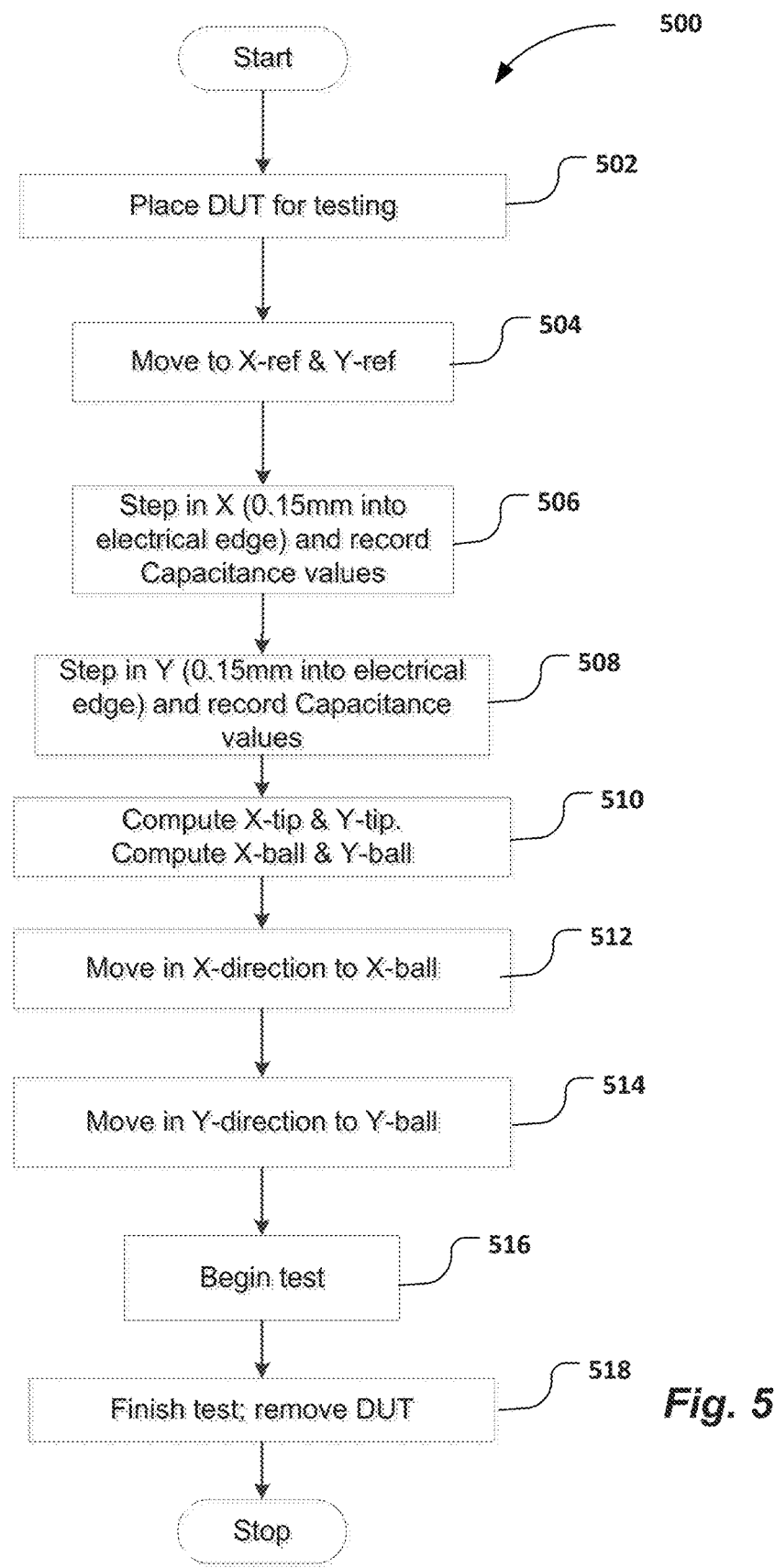
FIG. 5 is an example process flow diagram for aligning a testing component with a package in a system for testing packages, in accordance with some embodiments.

FIG. 5 is an example process flow diagram for aligning a testing component with a package in a system for testing packages, in accordance with some embodiments. The description of the process 500 will be provided with continuous reference to FIGS. 1-3. The process 500 (with the exception of block 502) and may be performed by the controller 134, which may cause the components of the positioning unit 140 to perform actions described in the process 500. For example, the controller 134 may cause the positioning unit 140 to move the testing component, such as PCB 124 as described below. Further, the controller 134 may perform the calculations according to the actions described below.

At block 502, the package 102 (DUT) may be disposed on the floating plate 122, on top of the bottom side contactor array 118 of the PCB 116 of the testing system 100.

At block 504, the PCB 124 may be moved to a reference position (X-ref; Y-ref) relative to the package 102. X-ref may be a known reference distance from the sensors 130 (e.g., sensor 302) to the DUT electrical (conductive) edge in X-direction. Y-ref may be a known reference distance from the sensors 130 (e.g., sensor 304) to DUT electrical edge in Y-direction.

At block 506, the PCB 124 may be moved in X (the step may comprise, for example, a distance of about 0.15 mm toward the electrical edge of the package 102), sense and record capacitance values, using sensors 130. In some embodiments, this linear step may be driven by a motor rotary step.

At block 508, the PCB 124 may be moved a step in Y-direction (the step may comprise, for example, a distance of about 0.15 mm toward the electrical edge), sense and record capacitance values, using sensors 130. In some embodiments, this linear step may be driven by a motor rotary step.

At block 510, the peak values X-tip, Y-tip of measured capacitance in X-direction and Y-direction may be computed. The peak capacitance values may indicate a location of the DUT's electrical edge. For example, X-tip may be the DUT's electrical edge in X-direction as detected by sensor 302. Y-tip may be a DUT's electrical edge in Y-direction as detected by sensor 304.

Further, the coordinates (location) of contacts (balls) of the interconnect array 110 (X-ball and Y-ball) may be computed. More specifically, X-ball is the X-coordinate of DUT's top side interconnect ball, which may be computed from X-tip and X-offset: X-ball=(X-tip)+(X-pin)+(X-offset). Y-ball is the Y-coordinate of DUT's top side interconnect ball, which may be computed from Y-tip and Y-offset: Y-ball=(Y-tip)+(Y-pin)+(Y-offset).

At block 512, the PCB 124 may be moved in X-direction to a position defined by X-ball.

At block 514, the PCB 124 may be moved in Y-direction to a position defined by Y-ball. In the position defined by X-ball and Y-ball, the top side contactor array 126 and interconnect array 110 may be aligned.

At block 516, the top side contactor array 126 may be engaged with the interconnect array 110. Accordingly, an integrated circuit test to electrically test the package 102 and its connections, including the interconnect array 110, may begin.

At block 518, the testing may be finished. The package 102 may be removed from the floating plate 122.

The embodiments for alignment of the testing equipment with a tested package described herein provide a number of advantages. As described, an electrical edge (e.g., electrical edge) of a package may be determined, as opposed to a physical edge of the package. Such determination may be done using sensors, such as capacitive sensors. Accordingly, a PCB based sensor design may be used in the described embodiments. A ground (GND) plane edge may be used as a package electrical edge to be detected.

The sensors may comprise any shape and/or size with or without GND shielding. The sensors may be used in single-ended or differential mode. The sensors may be calibrated in order for desired accuracy of alignment of the top side contactor array 126 with the top side interconnect array 110.

In embodiments, a plurality of sensors (e.g., two or more) may be used to detect package electrical edges. Two sensors, one in X-direction and one in Y-direction, may be used in some embodiments. Multiple sensors may be used for improved alignment accuracy and/or to increase degrees of freedom.

A top side PCB assembly (e.g., PCB 124) may be integrated with necessary circuitry to sense and to drive the top side contactor array 126 to the top side interconnect array 110. A PCB assembly integrated with circuitry to sense and drive the motors of the positioning unit 140 may be separate and connected to the PCB 124.

In some embodiments, an actuation mechanism to drive and align the top side contactor array 126 to top side interconnect array 110 may include a lead screw, and a nut coupled with a stepper motor may be used. A rack and pinion, cam, belt driven, piezoelectric, or other mechanisms may be used to translate rotary motion of the motor to a linear motion.

The testing system with alignment described herein may be integrated into existing interconnect technologies, such as sockets or PoP configurations. The alignment embodiments described herein may be used for fine pitch (<0.30 mm) bottom side contactor array 118 to align the bottom side interconnect array 114 to contactor array 118. A sensor placement, motor speed, and other parameters may be optimized for minimum test time.

The following paragraphs describe examples of various embodiments.

Example 1 may be a method for package testing, comprising: processing, by a controller of a package testing system, an input from one or more sensors disposed on a testing component of the package testing system to detect an electrical edge of a package to be tested, the processing including identifying the electrical edge of the package, wherein the package is disposed substantially opposite the testing component to face the testing component; and initiating, by the controller, an adjustment of a position of the testing component relative to the package, based at least in part on the electrical edge of the package, which includes causing contacts of the testing component to substantially align with respective interconnects of the package, to provide electrical connection between the contacts of the testing component with the respective interconnects of the package during a testing of the package.

Example 2 may include the method of Example 1, wherein initiating an adjustment of a position of the testing component includes causing, by the controller, the package testing system to apply a mechanical force to the testing component, wherein the testing component is movable relative to the package in response to the application of the mechanical force.

Example 3 may include the method of Example 1, wherein the one or more sensors comprise capacitive sensors.

Example 4 may include the method of Example 1, wherein the one or more sensors comprise at least a first sensor and a second sensor disposed in an area adjacent to a physical edge of the testing component.

Example 5 may include the method of Example 1, further comprising: receiving, by the controller, the input from the one or more sensors, wherein the input includes capacitance values that indicate the electrical edge of the package; and recording, by the controller, the received capacitance values.

Example 6 may include the method of Example 1, further comprising: causing, by the controller, the testing component to move in a first direction relative to the package for a first determined distance; recording, by the controller, a first capacitance value provided by one of the one or more sensors; causing, by the controller, the testing component to move in a second direction relative to the package for a second determined distance, wherein the second direction is substantially perpendicular to the first direction; and recording, by the controller, a second capacitance value provided by another one of the one or more sensors.

Example 7 may include the method of Example 6, further comprising: calculating, by the controller, a desired position of the testing component relative to the package, based at least in part on the recorded first and second capacitance values.

Example 8 may include the method of Example 7, wherein initiating an adjustment of a position of the testing component relative to the package includes: calculating, by the controller, a mechanical force to apply to the testing component, based at least in part on the calculated desired position; and causing, by the controller, an application of the mechanical force to the testing component, to move the testing component to the desired position.

Example 9 may include the method of Example 1, wherein the testing component comprises a top side printed circuit board (PCB), wherein the contacts of the testing component include a top side contactor array disposed to face the package, wherein the package comprises a bottom package of a package-on-package (PoP) configuration, wherein the respective interconnects of the package include a top side interconnect array disposed to face the top side contactor array, wherein causing the contacts of the testing component to align with respective interconnects of with the package includes aligning pins of the top side contactor array with respective contacts of the top side interconnect array.

Example 10 may include the method of Example 9, wherein the one or more sensors are disposed in an area adjacent to a corner of the PCB.

Example 11 may include the method of any Examples 1 to 10, wherein the testing component includes a bottom side contactor array, wherein the package comprises a printed circuit board having a bottom side interconnect array, wherein initiating an adjustment of a position of the testing component relative to the package includes aligning the bottom side contactor array with the bottom side interconnect array.

Example 12 may include the method of any Examples 1 to 10, wherein the package comprises an integrated circuit.

Example 13 may be a package testing system, comprising: a printed circuit board (PCB), including: one or more sensors disposed adjacent to a corner of the PCB to face a package to be tested, to detect an electrical edge of the package; and a contactor array disposed on the PCB to face respective interconnects of the package to be tested; and a controller coupled with the one or more sensors, to: process an input from the one or more sensors, to identify the electrical edge of the package; and initiate an adjustment of a position of the PCB relative to the package, based at least in part on the electrical edge of the package, to substantially align contacts of the contactor array with the respective interconnects of the package to be tested, to provide electrical connection between the contacts of the contactor array with the respective interconnects of the package during testing of the package.

Example 14 may include the system of Example 13, wherein the PCB is movable relative to the package in response to application of a mechanical force by the package testing system.

Example 15 may include the system of Example 13, wherein the contactor array is disposed substantially around at least two adjacent sides of the PCB.

Example 16 may include the system of Example 13, wherein the package comprises a die disposed on a package layer, wherein to detect an electrical edge of the package includes to sense an electrical edge of the package layer.

Example 17 may include the system of Example 13, wherein the package is to be disposed substantially opposite the PCB in the package testing system.

Example 18 may include the system of Example 16, wherein to process an input from the one or more sensors includes to: cause the PCB to move in a first direction relative to the package for a first determined distance, and to move in a second direction relative to the package for a second determined distance, wherein the second direction is substantially perpendicular to the first direction; record respective capacitance values provided by one of the one or more sensors in response to the movement of the package in the first and second directions; calculate a desired position of the PCB relative to the package, based at least in part on recorded first and second capacitance values, wherein the desired position provides for the substantial alignment of the contacts of the contactor array with the respective interconnects of the package; and calculate a mechanical force to apply to the PCB, based at least in part on the calculated desired position.

Example 19 may be one or more non-transitory controller-readable media having instructions for package testing stored thereon that, in response to execution on a controller of a package testing system, cause the controller to: process an input from one or more sensors disposed on a testing component of the package testing system to detect an electrical edge of a package to be tested, wherein to process includes to identify the electrical edge of the package, wherein the package is disposed substantially opposite testing component to face the testing component; and initiate an adjustment of a position of the testing component relative to the package, based at least in part on the electrical edge of the package, which includes to cause contacts of the testing component to substantially align with respective interconnects of the package, to provide electrical connection between the contacts of the testing component with the respective interconnects of the package during a testing of the package by the package testing system.

Example 20 may include the non-transitory controller-readable media of Example 19, wherein the instructions that cause the controller to initiate an adjustment of a position of the testing component relative to the package further cause the controller to cause the package testing system to apply a mechanical force to the testing component, wherein the testing component is movable relative to the package in response to the application of the mechanical force.

Example 21 may include the non-transitory controller-readable media of Example 20, wherein the instructions further cause the controller to receive the input from the one or more sensors, wherein the input includes capacitance values that indicate the electrical edge of the package, and record the received capacitance values.

Example 22 may include the non-transitory controller-readable media of Example 21, wherein the instructions further cause the controller to calculate a desired position of the testing component relative to the package, based at least in part on recorded first and second capacitance values, and calculate the mechanical force to apply to the testing component, based at least in part on the calculated desired position.

Example 23 may be a system for package testing, comprising: means for processing an input from one or more sensors disposed on a testing component of a package testing system to detect an electrical edge of a package to be tested, the processing including identifying the electrical edge of the package, wherein the package is disposed substantially opposite the testing component to face the testing component; and means for initiating an adjustment of a position of the testing component relative to the package, based at least in part on the electrical edge of the package, which includes causing contacts of the testing component to substantially align with respective interconnects of the package, to provide electrical connection between the contacts of the testing component with the respective interconnects of the package during a testing of the package.

Example 24 may include the system of Example 23, wherein means for initiating an adjustment of a position of the testing component includes means for causing the package testing system to apply a mechanical force to the testing component, wherein the testing component is movable relative to the package in response to the application of the mechanical force.

Example 25 may include the system of Example 23, wherein the one or more sensors comprise capacitive sensors.

Example 26 may include the system of Example 23, wherein the one or more sensors comprise at least a first sensor and a second sensor disposed in an area adjacent to a physical edge of the testing component.

Example 27 may include the system of Example 23, further comprising: means for receiving the input from the one or more sensors, wherein the input includes capacitance values that indicate the electrical edge of the package; and recording the received capacitance values.

Example 28 may include the system of Example 23, further comprising: means for causing the testing component to move in a first direction relative to the package for a first determined distance; means for recording a first capacitance value provided by one of the one or more sensors; means for causing the testing component to move in a second direction relative to the package for a second determined distance, wherein the second direction is substantially perpendicular to the first direction; and means for recording a second capacitance value provided by another one of the one or more sensors.

Example 29 may include the system of Example 28, further comprising: means for calculating a desired position of the testing component relative to the package, based at least in part on the recorded first and second capacitance values.

Example 30 may include the system of Example 29, wherein initiating an adjustment of a position of the testing component relative to the package includes: means for calculating a mechanical force to apply to the testing component, based at least in part on the calculated desired position; and means for causing an application of the mechanical force to the testing component, to move the testing component to the desired position.

Example 31 may include the method of any Examples 23 to 30, wherein the package comprises an integrated circuit.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method, comprising:
    processing, by a controller of a package testing system, an input from one or more sensors disposed on a testing component of the package testing system to detect an electrical edge of a package to be tested, the processing including identifying the electrical edge of the package, wherein the package is disposed substantially opposite the testing component to face the testing component;
    initiating, by the controller, an adjustment of a position of the testing component relative to the package, based at least in part on the electrical edge of the package, which includes causing contacts of the testing component to substantially align with respective interconnects of the package, to provide electrical connection between the contacts of the testing component with the respective interconnects of the package during a testing of the package;
    receiving, by the controller, the input from the one or more sensors, wherein the input includes capacitance values that indicate the electrical edge of the package; and
    recording, by the controller, the received capacitance values.

2. The method of claim 1, wherein initiating an adjustment of a position of the testing component includes causing, by the controller, the package testing system to apply a mechanical force to the testing component, wherein the testing component is movable relative to the package in response to the application of the mechanical force.

3. The method of claim 1, wherein the one or more sensors comprise capacitive sensors.

4. The method of claim 1, wherein the one or more sensors comprise at least a first sensor and a second sensor disposed in an area adjacent to a physical edge of the testing component.

5. The method of claim 1, further comprising:
    causing, by the controller, the testing component to move in a first direction relative to the package for a first determined distance;
    recording, by the controller, a first capacitance value provided by one of the one or more sensors;
    causing, by the controller, the testing component to move in a second direction relative to the package for a second determined distance, wherein the second direction is substantially perpendicular to the first direction; and recording, by the controller, a second capacitance value provided by another one of the one or more sensors.

6. The method of claim 5, further comprising:
calculating, by the controller, a desired position of the testing component relative to the package, based at least in part on the recorded first and second capacitance values.

7. The method of claim 6, wherein initiating an adjustment of a position of the testing component relative to the package includes:
calculating, by the controller, a mechanical force to apply to the testing component, based at least in part on the calculated desired position; and
causing, by the controller, an application of the mechanical force to the testing component, to move the testing component to the desired position.

8. The method of claim 1, wherein the testing component comprises a top side printed circuit board (PCB), wherein the contacts of the testing component include a top side contactor array disposed to face the package, wherein the package comprises a bottom package of a package-on-package (PoP) configuration, wherein the respective interconnects of the package include a top side interconnect array disposed to face the top side contactor array, wherein causing the contacts of the testing component to align with the respective interconnects of with the package includes aligning pins of the top side contactor array with respective contacts of the top side interconnect array.

9. The method of claim 8, wherein the one or more sensors are disposed in an area adjacent to a corner of the PCB.

10. The method of claim 1, wherein the testing component includes a bottom side contactor array, wherein the package comprises a printed circuit board (PCB) having a bottom side interconnect array, wherein initiating an adjustment of a position of the testing component relative to the package includes aligning the bottom side contactor array with the bottom side interconnect array.

11. The method of claim 1, wherein the package comprises an integrated circuit.

12. A package testing system, comprising:
a printed circuit board (PCB), including: one or more sensors disposed adjacent to a corner of the PCB to face a package to be tested, to detect an electrical edge of the package; and a contactor array disposed on the PCB to face respective interconnects of the package to be tested; and
a controller coupled with the one or more sensors, to: process an input from the one or more sensors, to identify the electrical edge of the package; and initiate an adjustment of a position of the PCB relative to the package, based at least in part on the electrical edge of the package, to substantially align contacts of the contactor array with the respective interconnects of the package to be tested, to provide electrical connection between the contacts of the contactor array with the respective interconnects of the package during testing of the package, wherein the package comprises a die disposed on a package layer, wherein to detect an electrical edge of the package includes to sense an electrical edge of the package layer, wherein to process an input from the one or more sensors includes to:
cause the PCB to move in a first direction relative to the package for a first determined distance, and to move in a second direction relative to the package for a second determined distance, wherein the second direction is substantially perpendicular to the first direction;
record respective capacitance values provided by one of the one or more sensors in response to the movement of the package in the first and second directions;
calculate a desired position of the PCB relative to the package, based at least in part on recorded first and second capacitance values, wherein the desired position provides for the substantial alignment of the contacts of the contactor array with the respective interconnects of the package; and
calculate a mechanical force to apply to the PCB, based at least in part on the calculated desired position.

13. The system of claim 12, wherein the PCB is movable relative to the package in response to application of a mechanical force by the package testing system.

14. The system of claim 12, wherein the contactor array is disposed substantially around at least two adjacent sides of the PCB.

15. The system of claim 12, wherein the package is to be disposed substantially opposite the PCB in the package testing system.

16. One or more non-transitory controller-readable media having instructions stored thereon that, in response to execution on a controller of a package testing system, cause the controller to:
receive an input from one or more sensors disposed on a testing component of the package testing system to detect an electrical edge of a package to be tested, wherein the input includes capacitance values that indicate the electrical edge of the package, and record the received capacitance values;
process the input from the one or more sensors, wherein to process includes to identify the electrical edge of the package, wherein the package is disposed substantially opposite the testing component to face the testing component; and
initiate an adjustment of a position of the testing component relative to the package, based at least in part on the electrical edge of the package, which includes to cause contacts of the testing component to substantially align with respective interconnects of the package, to provide electrical connection between the contacts of the testing component with the respective interconnects of the package during a testing of the package by the package testing system.

17. The non-transitory controller-readable media of claim 16, wherein the instructions that cause the controller to initiate an adjustment of a position of the testing component relative to the package further cause the controller to cause the package testing system to apply a mechanical force to the testing component, wherein the testing component is movable relative to the package in response to the application of the mechanical force.

18. The non-transitory controller-readable media of claim 16, wherein the instructions further cause the controller to calculate a desired position of the testing component relative to the package, based at least in part on recorded first and second capacitance values, and calculate the mechanical force to apply to the testing component, based at least in part on the calculated desired position.

* * * * *